(12) United States Patent
Kuwazawa

(10) Patent No.: US 6,909,144 B2
(45) Date of Patent: Jun. 21, 2005

(54) MIS TRANSISTOR HAVING AN LDD STRUCTURE

(75) Inventor: Kazunobu Kuwazawa, Chino (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 10/194,406

(22) Filed: Jul. 12, 2002

(65) Prior Publication Data

US 2003/0030114 A1 Feb. 13, 2003

(30) Foreign Application Priority Data

Jul. 13, 2001 (JP) .......................................... 2001-213419
Jul. 10, 2002 (JP) .......................................... 2002-201663

(51) Int. Cl.[7] .......................... H01L 29/76; H01L 29/94; H01L 31/062; H01L 31/113; H01L 31/119
(52) U.S. Cl. ........................ 257/336; 257/344; 257/408; 257/900
(58) Field of Search ................................. 257/336, 344, 257/408, 900

(56) References Cited

U.S. PATENT DOCUMENTS 5,534,449 A * 7/1996 Dennison et al. ........... 438/231
5,757,045 A * 5/1998 Tsai et al. .................... 257/336
6,137,137 A * 10/2000 Wu .............................. 257/336

* cited by examiner

*Primary Examiner*—Thien F Tran
(74) *Attorney, Agent, or Firm*—Harness, Dickey & Pierce, P.L.C.

(57) ABSTRACT

A gate electrode 14 is formed through a gate oxide film 13 over a channel region 12 in an element region 11, and sidewall dielectric films 16 are provided on side sections of the gate electrode 14. Source/drain regions 17 include low concentration impurity regions 171 and high concentration impurity regions 172. The impurity regions 172 are provided, by an over-etching method when forming the sidewalls 16, at a disposition level LV2 in the element region 11, which is lower than a disposition level LV1 where the impurity regions 171 are disposed. Assisting impurity regions 173 are provided in regions where the levels change between level LV1 and LV2. As a result, the continuity of impurity regions between the impurity regions 172 and the impurity regions 171 that are low concentration extension regions is secured, the their electrical connection is stabilized.

1 Claim, 4 Drawing Sheets

<Angled Ion Injection>
Formation of Assisting N region

<Angled Ion Injection>
Formation of P+ regoin (Pocket Ion Injection Region)

MIS TRANSISTOR HAVING AN LDD STRUCTURE

BACKGROUND OF THE INVENTION

1. Technical Field of the Invention

The present invention relates to semiconductor devices including miniaturized dielectric gate type transistors, and more particularly to a MIS transistor having an LDD (Lightly Doped Drain) structure, in other words extension regions and a method for fabricating the same.

2. Conventional Technology

With the progress in higher large-scale integration and miniaturization of semiconductor integrated circuits, step up operations with lower power supply voltages are required. Under such circumstances, MIS transistors (Field Effect MIS transistors: MISFETs) generally adopt LDD structure.

The LDD structure is also called an extension region of source/drain. As is well known, low concentration regions in source/drain regions are formed in advance by injecting impurity ions by using a region of the gate electrode as a mask prior to forming sidewalls on the gate electrode. With further miniaturization of MOS transistors, the low concentration regions (extension regions) of the source/drain regions have become shallower.

Also, the impurity concentration in channel sections of MOS transistors tends to be increased to a higher concentration level to counter a fear of the short channel effect and to restrain punch through effects. In addition, as a more advanced counter measure, so called pocket ions may be injected.

The pocket ion injection forms impurity regions of an opposite conductive type to that of the source/drain regions at least below low concentration extension regions (i.e., pocket ion injection regions). This prevents the punch through phenomenon, and suppresses leak currents across the source and the drain.

Pocket ion injection regions may be formed in a stage, for example, before or after the extension regions are formed, by injecting ions. Ions may be injected through a resist pattern. The pocket ion injection regions may also be called "Holo regions".

FIG. 8 shows a cross-sectional view of a structure of a conventional MIS transistor. A gate electrode 84 is formed through a gate oxide film 83 over a channel region 82 in, for example, a P-type element region 81 of a semiconductor substrate. N-type source/drain regions 87 that are separated from each other across a channel region are formed in the semiconductor substrate below both ends of the gate electrode 84.

The source/drain region 87 is formed from a low concentration N-type impurity region (N$^-$ region) 871 and a high concentration N-type impurity region (N$^+$ region) 872. Prior to forming sidewall dielectric films 86 at the gate electrode 84, the N$^-$ regions 871 are formed in advance as an LDD structure, i.e., extension regions by injecting ions using a region of the gate electrode 84 as a mask.

When the sidewall dielectric films 86 are formed, since the material of the sidewall dielectric films 86 (for example, silicon oxide films or silicon nitride films) and the semiconductor substrate have a low selective ratio in etching, the semiconductor substrate may be over-etched.

In this case, if the extension regions (N$^-$ regions 871) are shallowly formed, the source/drain regions 87, there is a great danger that the source/drain regions 87 become discontinuous in sections encircled by broken lines at the low concentration N-type impurity regions (N$^-$ regions) 871 and the high concentration N-type impurity regions (N$^+$ regions) 872. As a result, the electrical resistance value across the impurity regions 871 and 872 increases, and thus it is feared that the transistor performance deteriorates. Also, this over-etching may cause in not a few occasions situations in which the N$^-$ regions 871 below the sidewalls are almost eliminated. As a countermeasure, the extension regions (N$^-$ regions 871) may be formed deeper. However, this is not a technique appropriate for the miniaturization, and therefore is not very much preferred.

Also, to prevent punch through, P-type high concentration impurity regions (pocket ion injected regions) of an opposite conductive type to that of the source/drain regions may be formed in areas indicated by broken lines below the extension regions. In this case, a measure to limit the concentration (suppress to a lower level) of the pocket ion injected regions also needs to be taken into consideration. In other words, this is needed to stably obtain the N$^-$ regions 871 and N$^+$ regions 872 without a fear that they become discontinuous. However, this is not a technique appropriate for the miniaturization, either, and therefore is not very much preferred.

The present invention has been made in view of the circumstances described above, and its object is to provide miniaturized MIS transistors that are highly reliable and can effectively suppress punch through, and a method for fabricating the same.

SUMMARY OF THE INVENTION (1) A semiconductor device in accordance with the present invention pertains to a semiconductor device including a MIS transistor comprising a semiconductor substrate;

a gate dielectric film provided above the semiconductor substrate;

a gate electrode provided above the gate dielectric film; and a sidewall dielectric film provided on a side surface of the gate electrode, wherein the semiconductor substrate is characterized in comprising:

source/drain regions having first impurity regions of a first conductive type that becomes to be extension regions with a low concentration and second impurity regions including an impurity of the first conductive type of the MIS transistor, the second impurity regions including the impurity of the first conductive type in a higher concentration than the first impurity regions and being provided adjacent to the respective first impurity regions; stepped sections in a surface of the source/drain regions; and third impurity regions of the first conductive type below the first impurity regions and at the stepped sections.

With the semiconductor device in accordance with the present invention, the third impurity region is provided at a region where disposed levels of the first impurity region and the second impurity region change (at stepped section). This assures the continuity between these impurity regions. The low concentration extension regions can be formed in shallow junctions, and the reliability of the semiconductor device improves.

(2) A semiconductor device in accordance with the present invention may be characterized in that, in the semiconductor device recited in (1) above, the semiconductor substrate includes fourth impurity regions of a second conductive type that is an opposite conductive type of the first conductive type, provided below the first impurity regions and adjacent to the third impurity regions.

The invention described above further prevent punch through, and improves the reliability of the semiconductor device.

(3) A semiconductor device in accordance with the present invention may be characterized in that, in the semiconductor device recited in (1) above, the third impurity regions are formed opposing to each other across a channel region, and a distance between the third impurity regions is greater than a distance between the first impurity regions.

(4) A semiconductor device in accordance with the present invention may be characterized in that, in the semiconductor device recited in (1) above, the semiconductor substrate includes fourth impurity regions of a second conductive type that is an opposite conductive type of the first conductive type, provided below the first impurity regions and adjacent to the third impurity regions, the third impurity regions are formed opposing to each other across a channel region, and a distance between the third impurity regions is longer than a distance between the first impurity regions.

(5) A semiconductor device in accordance with the present invention may be characterized in that, in the semiconductor device recited in (2) above, the fourth impurity regions are formed opposing to each other across the channel region, and a distance between the fourth impurity regions is longer than a distance between the third impurity regions.

(6) A method for fabricating a semiconductor device is characterized in comprising the steps of:

forming, above a semiconductor substrate, a gate dielectric film and a gate electrode provided above the gate dielectric film;

forming impurity regions of a first conductive type that become to be part of source/drain regions of a MIS transistor and to be extension regions with a low concentration by injecting an impurity of the first conductive type in the semiconductor substrate with a region where the gate electrode of the semiconductor substrate is provided above being masked;

forming a dielectric film that covers the gate electrode;

forming stepped sections on a surface of the source/drain regions of the semiconductor substrate by etching the dielectric film to form sidewall dielectric films on side surfaces of the gate electrode;

forming second impurity regions that form part of the source/drain regions of the MIS transistor in the semiconductor substrate and include an impurity of the first conductive type with a higher concentration than the first impurity region with a region where the gate electrode and the sidewalls of the semiconductor substrate are provided above being masked; and forming third impurity regions of the first conductive type at least below the stepped sections and the first impurity regions with a region where the gate electrode and the sidewalls of the semiconductor substrate are provided above being masked.

(7) A method for fabricating a semiconductor device may be characterized in that the method for fabricating a semiconductor device recited in (6) above may further comprise, before the step of forming the third impurity regions, the step of forming fourth impurity regions of a second conductive type that is an opposite conductive type of the first conductive type, provided below the first impurity regions and adjacent to the third impurity regions.

(8) A method for fabricating a semiconductor device may be characterized in that the method for fabricating a semiconductor device recited in (6) above may further comprise, after the step of forming the third impurity regions, the step of forming fourth impurity regions of a second conductive type that is an opposite conductive type of the first conductive type, provided below the first impurity regions and adjacent to the third impurity regions.

(9) A method for fabricating a semiconductor device may be characterized in that, in the method for fabricating a semiconductor device recited in (6) above, in the step of forming the third impurity regions, the third impurity regions are formed such that the concentration of the impurity of the first conductive type in the third impurity regions becomes to be generally equal to the concentration of the impurity of the first conductive type in the first impurity regions.

(10) A method for fabricating a semiconductor device may be characterized in that, in the method for fabricating a semiconductor device recited in (6) above, in the step of forming the third impurity regions, the third impurity regions are formed across a channel region such that a distance between the third impurity regions becomes to be longer than a distance between the first impurity regions.

(11) A method for fabricating a semiconductor device may be characterized in that, in the method for fabricating a semiconductor device recited in (7) above, in the step of forming the fourth impurity regions, the fourth impurity regions are formed across a channel region such that a distance between the fourth impurity regions becomes to be longer than a distance between the third impurity regions.

(12) A method for fabricating a semiconductor device may be characterized in that, in the method for fabricating a semiconductor device recited in (8) above, in the step of forming the fourth impurity regions, the fourth impurity regions are formed across a channel region such that a distance between the fourth impurity regions becomes to be longer than a distance between the third impurity regions.

DETAILED DESCRIPTION OF THE PREFERRED EMBODIMENTS OF THE PRESENT INVENTION

Figure 1:
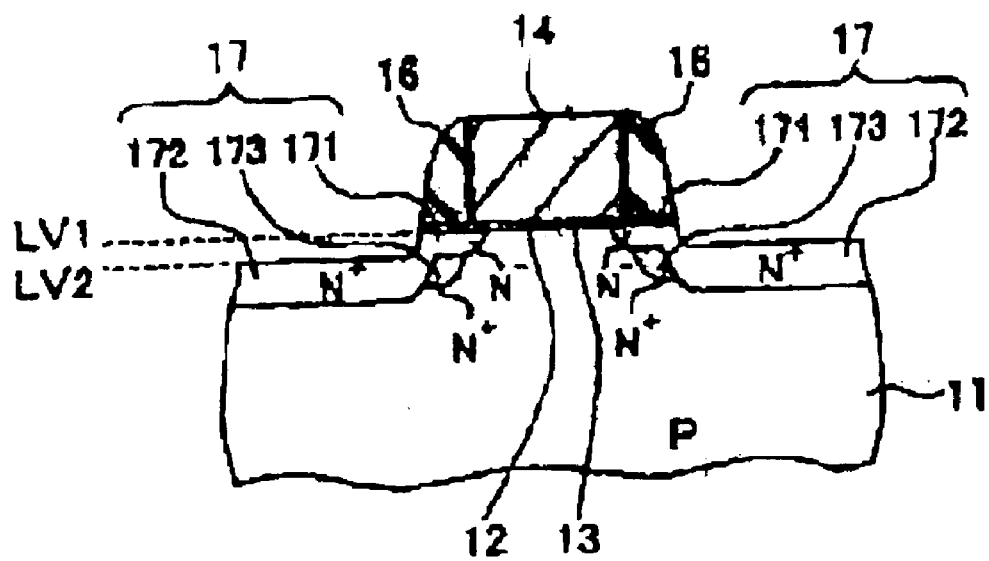
FIG. 1 shows a structure of key compositions of a semiconductor device in accordance with a first embodiment of the present invention.

FIG. 1 shows a structure of a MOS transistor in accordance with a first embodiment of the present invention, and shows a cross-sectional view of the structure of a key section of a miniaturized MOSFET with a relatively short channel length in an integrated circuit.

A gate electrode 14 is formed through a gate oxide film 13 over a channel region 12 in, for example, a P-type element region 11 of a semiconductor substrate. Dielectric films 16 (hereafter referred to as "sidewall dielectric films 16") are provided on side sections of the gate electrode 14. Source/drain regions 17 are formed separated from each other across a channel region 12 and each include a low concentration N-type impurity region ($N^-$ region) 171 and a high concentration N-type impurity region ($N^+$ region) 172.

The $N^-$ regions 171 are formed as LDD (Lightly Doped Drain regions), i.e., extension regions separated from one another by the channel region 12 below both ends of the gate electrode 14. Further, the $N^+$ regions 172 are provided at a disposition level LV2 in the surface of the semiconductor substrate, which is lower than a disposition level LV1 where the $N^-$ regions 171 are disposed. In other words, the source/drain regions each have a stepped section in the surface of the semiconductor substrate (at a section where the surface of the semiconductor substrate has a height difference between the disposition level VL1 and the disposition level LV2, i.e., a region where LV1 changes to LV2). The disposition level LV2 is determined by the amount of over-etching when the sidewall dielectric films 16 are formed in the region including the $N^+$ regions 172 of the semiconductor substrate.

In the present embodiment, assisting $N^+$ regions 173 are provide at the stepped sections. These can effectively prevent separations between the high concentration source/drain region, the $N^+$ region 172, and the low concentration extension region, the $N^-$ region 171. The assisting $N^+$ region 173 may include impurity, for example, in a higher concentration than the adjacent $N^-$ region 171, and a lower concentration than the $N^+$ region 172. Alternatively, the assisting $N^+$ region 173 may include N-type impurity in generally the same concentration as that of the $N^-$ region 171 that is a low concentration extension region. In this case, the punch through phenomenon can be better prevented. In other words, the assisting $N^+$ region 173 is provided by ion injection, and electrically connects the $N^+$ region 172 and the $N^-$ region 171, or compensates for the electrical connection between the $N^+$ region 172 and the $N^-$ region 171. Furthermore, the distance between the assisting $N^+$ regions 173 opposing to each other across the channel region 12 may be provided to be longer than the distance between the impurity regions 171 that define the extension regions opposing to each other across the channel region 12. In this case, the capability to prevent punch through can be further improved.

Figure 2:
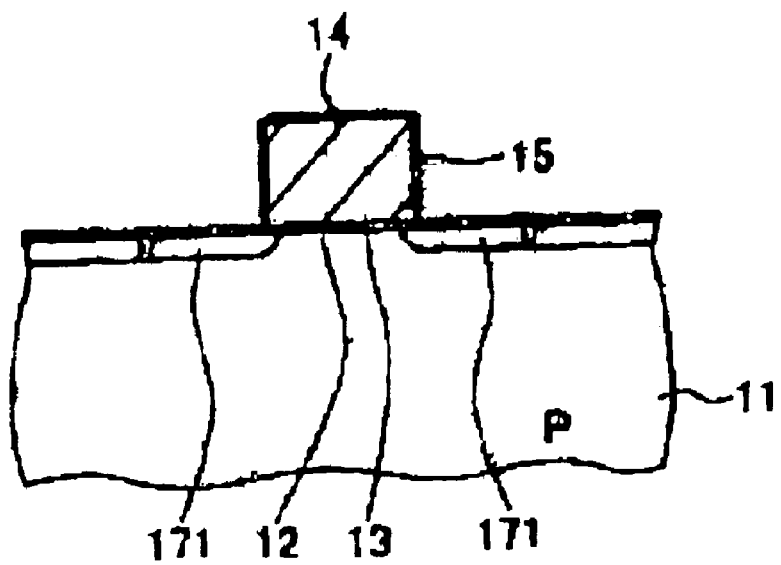
FIG. 2 shows in the manufacturing order a first cross-sectional view of a key section of a method for fabricating the semiconductor device of FIG. 1.
Figure 3:
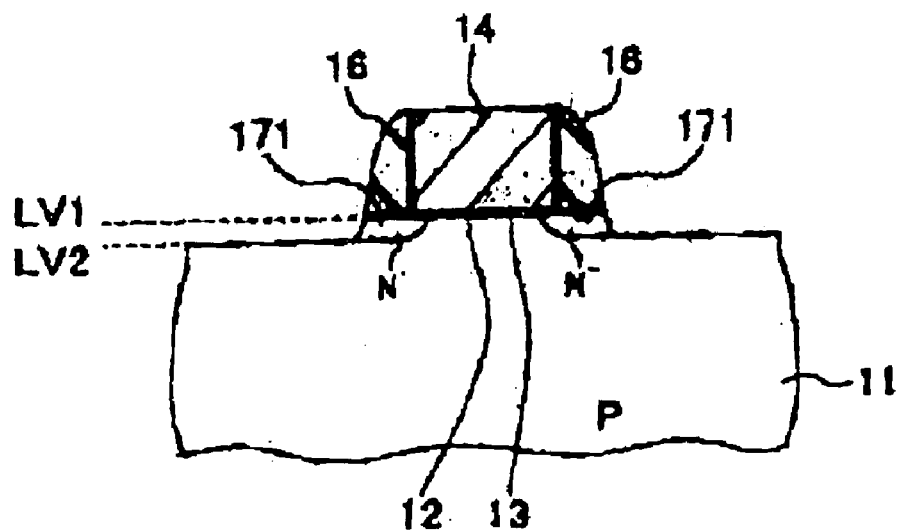
FIG. 3 shows in the manufacturing order a second cross-sectional view of a key section of the method for fabricating the semiconductor device of FIG. 1.
Figure 4:
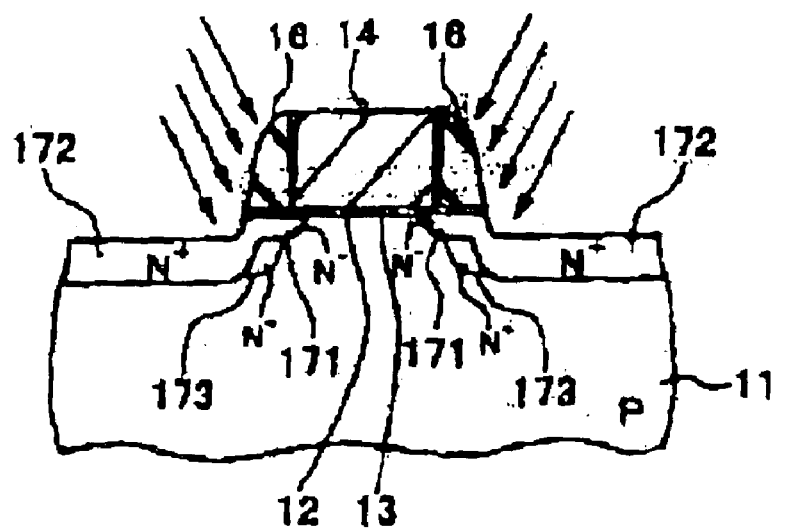
FIG. 4 shows in the manufacturing order a third cross-sectional view of a key section of the method for fabricating the semiconductor device of FIG. 1.

FIGS. 2–4 show in cross sections key portions in the manufacturing order of a method for fabricating a semiconductor device including a miniaturized MIS transistor similar to the one in the embodiment shown in FIG. 1.

First, as shown in FIG. 2, a gate dielectric film 13 of about 2 nm thick, and a gate electrode 14 having a width of about 100 nm with a polysilicon layer of about 200 nm thick thereon are formed in a specified region on, for example, a P-type element region 11 in the semiconductor substrate. Then, an oxide film 15 is formed on the surface of the gate electrode 15. For example, the oxide film 15 may be formed using a thermal oxidation method. Impurity for controlling the threshold value of the element may be injected in a region that becomes to be a channel region 12.

Next, at least a region in which the gate electrode 14 is provided is masked, and low concentration N-type impurity regions ($N^-$ regions) 171 that become extension regions of the source/drain regions are formed by an ion injection method to form an LDD structure. The ion injection may be conducted under conditions in which for example arsenic is injected with an acceleration voltage of about 5 KeV and a dose of about $1 \times 10^{14} - 1 \times 10^{15}$ cm$^{-2}$.

Next, as shown in FIG. 3, a thick dielectric film (for example, silicon nitride film) that covers over the gate electrode 14 is deposited, and then is anisotropically etched by an RIE (Reactive Ion Etching) method or the like to form dielectric films 16 (hereafter referred to as "sidewall dielectric films 16") on side surfaces of the gate electrode 14. When forming the sidewall dielectric films 16, the semiconductor substrate is over-etched. More specifically, during the etching process in forming the sidewall dielectric films 16, step differences are formed in the semiconductor substrate between the surface of a region where the gate electrode is formed above and the surface of regions that include at least $N^+$ regions 172 that become to be high concentration source/drain regions. In other words, step differences are generated in the semiconductor substrate surface in the source/drain regions. Stated otherwise, the level LV2 in the element region 11 other than at least the gate electrode 14 and the sidewall dielectric films 16 reaches a level deeper than the $N^-$ regions 171 compared to the disposition level LV1 of the $N^-$ regions 171 in the extension regions.

Next, as shown in FIG. 4, a region covering at least the gate electrode 14 and the sidewall dielectric films 16 is masked, and N-type impurity regions that become to be high concentration source/drain regions ($N^+$ regions) 172 are formed by an ion injection method. The $N^+$ regions 172 are formed under ion injection conditions in which for example arsenic is injected with an acceleration voltage of about 70 KeV and a dose of about $2 \times 10^{15} - 4 \times 10^{15}$ cm$^{-2}$.

Furthermore, a region covering at least the gate electrode 14 and the sidewall dielectric films 16 is masked, and N-type impurity ions are injected at a specified angle in the semiconductor substrate. As a result, assisting $N^+$ regions 173 having a lower concentration than the $N^+$ regions 172 are formed. The concentration of the N-type impurity in the assisting impurity regions may be the same as the concentration of the N-type impurity in the extension regions, or may be higher than the concentration of the N-type impurity in the extension regions. The assisting $N^+$ regions 173 may be formed by using an angled ion injection method. When the angled ion injection method is used, the permissible range of angles of incidence θ of injecting ions with respect to the semiconductor substrate may be 7°<θ<30° angled from a direction perpendicular to the semiconductor substrate. As a result, the impurity regions 173 can be more securely provided between the impurity regions 171 and 172. The ion injection may be conducted under conditions in which for example arsenic is injected with an acceleration voltage of about 10–20 KeV and a dose of about $5 \times 10^{14} - 1 \times 10^{15}$ cm$^{-2}$.

In other words, the assisting $N^+$ regions 173 have a function to compensate for the continuity between the high concentration N-type impurity regions (N$^+$ regions) 172 and the N$^-$ regions 171 that are low concentration extension regions.

In accordance with the embodiment described above, by the process for forming the assisting N$^+$ regions 173 including the angled ion injection step, the impurity having the same conductive type as that of the source/drain regions is introduced in the stepped sections of the semiconductor substrate surface. As a result, the assisting N$^+$ regions 173 can compensate for the mutual continuity between the N$^+$ regions 172 that are high concentration source/drain regions and the N$^-$ regions 171 that are low concentration extension regions. Accordingly, even when the low concentration extension regions are shallowly formed, the reliability of the semiconductor device can be secured.

Figure 5:
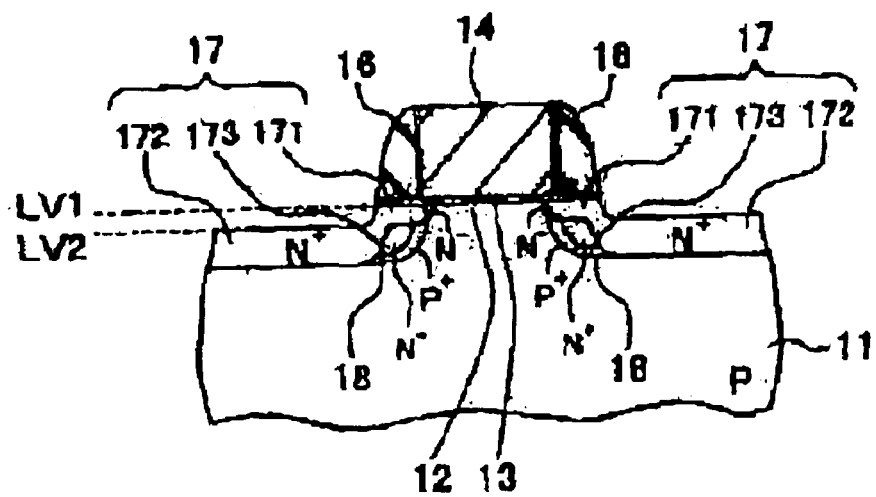
FIG. 5 shows a structure of key compositions of a semiconductor device in accordance with a second embodiment of the present invention.

FIG. 5 shows a structure of a MOS transistor in accordance with a second embodiment of the present invention, and shows a cross-sectional view of the structure of a key section of a miniaturized MOSFET with a relatively short channel length in an integrated circuit. The embodiment is described while sections that are the same as those of the first embodiment are indicated with the same reference numbers.

A difference from the first embodiment is to form pocket ion injected regions 18 (P+ regions 18), which are regions of P-type impurity that is an opposite conductive type to that of the source/drain regions, below at least the N$^-$ regions 171 that are low concentration extension regions. Other components are the same as those of the first embodiment.

More specifically, a gate electrode 14 is provided through a gate oxide film 13 over a channel region 12 in an element region 11, and source/drain regions including N$^-$ regions (extension regions) 171 and N$^+$ regions 172 continuing thereto are formed below sidewall dielectric films 16.

The N$^+$ regions 172 are provided at a disposition level LV2 in the element region 11, which is lower than a disposition level LV1 where the N$^-$ regions 171 are disposed. The disposition level LV2 is a level that is equivalent to or deeper than the depth of the N$^-$ regions 171, and is determined by the amount of over-etching when the sidewall dielectric films 16 are formed. Assisting N$^+$ regions 173 are provided in stepped sections (in regions where the disposition levels LV1–LV2 change) to compensate for the continuity between the N$^+$ regions 172 and the N$^-$ regions 171. In other words, the assisting impurity regions 173 are provided below the impurity regions 171 that become to be extension regions. In this instance, the distance between the assisting impurity regions 173 opposing to each other across the channel region 12 may be provided to be longer than the distance between the pocket ion injected regions opposing to each other across the channel region 12.

Furthermore, in this embodiment, P$^+$ regions 18 having an opposite conductive type to that of the source/drain regions are formed in regions below the N$^-$ regions 171 that are extension regions and adjacent to the assisting N$^+$ regions 173. The P$^+$ regions 18 are so-called pocket ion injected regions (which may also be called "Halo regions"). By forming these, the capability to prevent punch through can be further enhanced, and leak currents across the source/drain can be suppressed.

Figure 6:
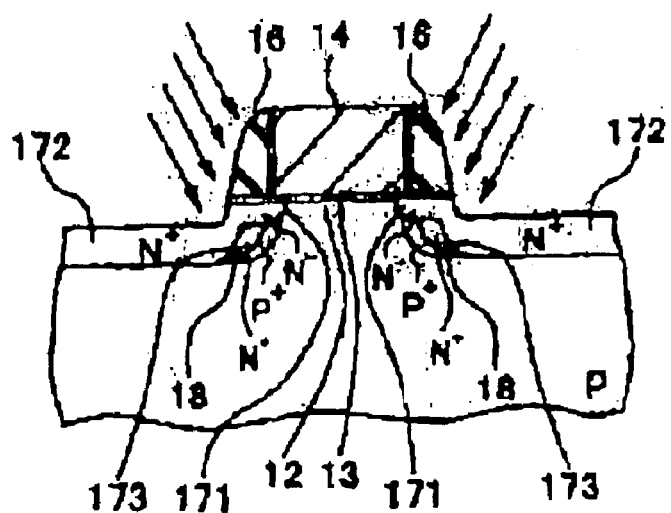
FIG. 6 shows a cross-sectional view of a key section of a method for fabricating the semiconductor device of FIG. 5.

FIG. 6 shows in cross section a key portion of a method for fabricating a miniaturized MOSFET similar to the one in the embodiment shown in FIG. 5.

A gate oxide film 13, a gate electrode 14, N$^-$ regions (extension regions) 171, sidewall dielectric films 16, N$^+$ regions 172, and assisting N$^+$ regions 173 are formed through steps similar to the steps described above with reference to FIGS. 2–4.

Then, as shown in FIG. 6, a region covering at least the gate electrode 14 and the sidewall dielectric films 16 is masked, and P-type impurity is ion-injected at specified angles. The P-type impurity regions may be formed by using an angled ion injection method. In this instance, the ions are injected under conditions in which for example boron is injected with an acceleration voltage of about 10–25 KeV and a dose of about $1 \times 10^{13}$–$5 \times 10^{13}$ cm$^{-2}$. As a result, the P$^+$ regions 18 are formed in regions below the N$^-$ regions 171 that are low concentration extension regions and adjacent to the assisting N$^+$ regions 173. The permissible range of angles of incidence θ of injecting ions in the angled ion injection may be 7°<θ<30° angled from a direction perpendicular to the semiconductor substrate. By this, the P$^+$ regions 18 that become so-called pocket ion injected regions can be formed with good controllability.

By the above-described embodiment and method, the assisting N$^+$ regions 173 thus formed compensate for the continuity between the N$^+$ regions 172 that are high concentration source/drain regions and the N$^-$ regions 171 that are low concentration extension regions, and stabilize the electrical connection between the impurity regions 172 and 171. As a result, the restriction on the injection concentration of impurity that forms the pocket ion injected regions 18 can be alleviated.

In other words, the electrical resistance value across the N$^+$ regions 172 and the N$^-$ regions 171 can be controlled by the impurity concentration of the assisting N$^+$ regions 173 and the P$^+$ regions 18. For this reason, strict controls that may be needed to restrict the impurity concentration of the P$^+$ regions 18 become unnecessary. In this manner, even when MOSFETs are further miniaturized, it is possible to achieve a structure that can improve the electrical resistance values across the impurity regions 172 and the impurity regions 171 and restrict punch through.

It is noted that the present invention is also effective in transistors in an opposite conductive type against the embodiments described above. Impurities in opposite conductive types that are to be ion-implanted may be used, and components in a specified element region may be formed in the manner similar to those shown in FIGS. 2–4.

Figure 7:
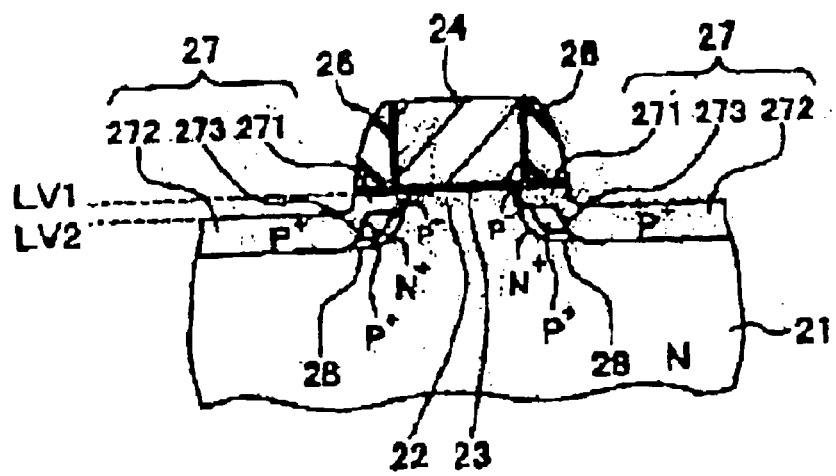
FIG. 7 shows a cross section of a semiconductor device (a semiconductor device including P channel MIS transistor) that is in opposite conductive type against the one shown in FIG. 5, which adopts the structure of the present invention shown in FIG. 5.
Figure 8:
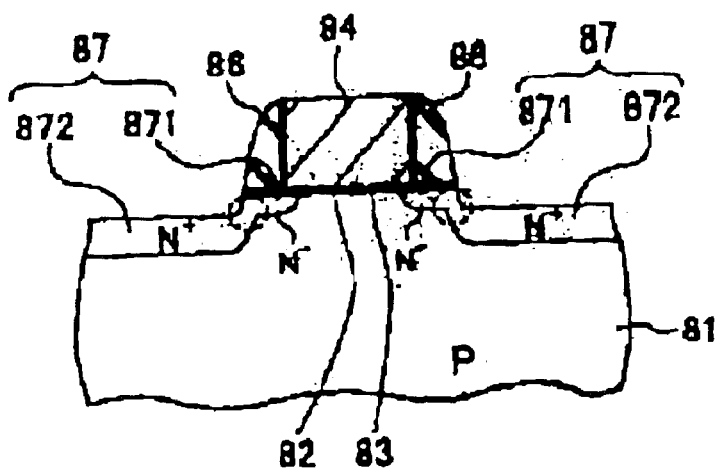
FIG. 8 shows a cross-sectional view of a structure of a conventional semiconductor device.

FIG. 7 shows a cross section of a MOS transistor (P channel MOS transistor) that is in opposite conductive type against the one shown in FIG. 5, which adopts the structure of the present invention shown in FIG. 5, for example.

More specifically, a gate electrode 24 is formed through a gate oxide film 23 over a channel region 22 in an N-type element region 21 of the same semiconductor substrate shown in FIG. 5. With a region of at least the gate electrode 24 being masked, low concentration P-type impurity regions (P$^-$ regions) 271 are formed. Dielectric films 26 (hereafter referred to as "sidewall dielectric films 26") are provided at side sections of the gate electrode 24. Step differences are generated, among the semiconductor substrate, between the surface of a region above which the gate electrode 24 is formed and the surface of regions including at least the P$^+$ regions 272 that become to be high concentration source/drain regions. In other words, the level LV2 in the element region 21 other than at least the gate electrode 24 and the sidewall dielectric films 26 reaches a level deeper than the P$^-$ regions 271 compared to the disposition level LV1 of the P$^-$ regions 271 in the extension regions. Stepped sections are formed on the semiconductor substrate surface in the source/drain regions 27.

Assisting P⁺ regions 273 are formed (at the stepped sections) between the P⁻ regions 271 at the disposition level VL1 and the P⁺ regions 272 at the disposition level LV2. Accordingly, these can compensate for separations between the impurity regions 271 and 272. The assisting P⁺ regions 273 may include impurity of a higher concentration than the adjacent P⁻ regions 271, and a lower concentration than the P⁺ regions 272. The assisting P⁺ regions 273 are provided by an ion injection method. The assisting P⁺ regions 273 compensate for the electrical connection between the P⁺ regions 272 and the N⁻ regions 271. Also, the assisting P⁺ regions 273 may include P-type impurity with generally the same concentration as that of the P⁻ regions 171 that are low concentration extension regions. In this case, the punch through phenomenon can be better prevented. In summary, the assisting P⁺ regions 273 are provided by an ion injection method, and electrically connects the P⁺ regions 272 and the P⁻ regions 271, or compensate for the electrical connection between the P⁺ regions 272 and the P⁻ regions 271. Furthermore, the distance between the assisting impurity regions 273 disposed opposing to each other across the channel region 22 may be provided to be longer than the distance between the impurity regions 271 that become to be extension regions provided opposing to each other across the channel region 22. In this case, the capability to prevent punch through can be further enhanced.

Then, N⁺ regions 28 may be formed in regions below the P⁻ regions 271 that are low concentration extension regions and adjacent to the assisting P⁺ regions 273. The N⁺ regions 28 are so-called pocket ion injected regions (which may also be called "Halo regions"). By forming these, the capability to prevent punch through can be further enhanced, and leak currents across the source/drain can be suppressed. The distance between the assisting impurity regions 273 disposed opposing to each other across the channel region 22 may be provided to be longer than the distance between the pocket ion injected regions 273 disposed opposing to each other across the channel region 22.

As described above, in accordance with the present invention, to compensate for separations between high concentration source/drain regions and low concentration extension regions, ion injected regions having the same conductive type as that of the source/drain regions are provided between them. As a result, the continuity of impurity regions of the same conductive type between the high concentration source/drain regions and the low concentration extension regions can be secured, and highly reliable semiconductor devices can be obtained even when the low concentration extension regions are formed in shallow junctions.

Also, when pocket ion injected regions are provided to restrict punch through, the restrictions on the impurity concentration at the time of pocket ion injection can be alleviated because the continuity in the source/drain regions at the stepped sections is compensated. As a result, MOS transistors that are suitable for miniaturization and that realize extension regions in shallow junctions and excel in controlling punch through and methods for fabricating the same are provided.

What is claimed is:

1. A semiconductor device including a MIS transistor comprising:

a semiconductor substrate;

a gate dielectric film provided above the semiconductor substrate;

a gate electrode provided above the gate dielectric film; and a sidewall dielectric film provided on a side of the gate electrode;

first impurity regions of a first conductive type, the first impurity regions constituting LDD regions;

second impurity regions including an impurity of the first conductive type, the second impurity constituting source and drain regions;

third impurity regions of the first conductive type below the first impurity regions; and fourth impurity regions of a second conductivity type provided adjacent to the third impurity regions, wherein the fourth impurity regions terminate at a lower edge of the first impurity regions, and wherein the third impurity regions are formed opposing to each other with a channel region being interposed therebetween, and a distance between the third impurity regions is greater than a distance between the first impurity regions.

* * * * *